United States Patent [19]
Yamazaki et al.

[11] Patent Number: 5,462,800
[45] Date of Patent: Oct. 31, 1995

[54] SILICON CARBIDE COATED CARBON COMPOSITE MATERIAL AND METHOD FOR MAKING SAME

[75] Inventors: Hiraku Yamazaki, Chiba; Teruo Sugai, Tokyo; Shigeo Kato; Haruo Tazoe, both of Yamagata; Shiroh Hotate, Fuchu; Iwao Goto, Kanagawa, all of Japan

[73] Assignee: Toshiba Ceramics Co., Tokyo, Japan

[21] Appl. No.: 169,751

[22] Filed: Dec. 20, 1993

Related U.S. Application Data

[63] Continuation of Ser. No. 47,375, Apr. 15, 1993, abandoned, which is a continuation of Ser. No. 773,316, Oct. 10, 1991, abandoned.

[30] Foreign Application Priority Data

Oct. 11, 1990 [JP] Japan .................. 2-272710

[51] Int. Cl.$^6$ ............... B01J 8/02; C01B 31/02; D01F 9/12; B32B 9/00
[52] U.S. Cl. .............. 428/408; 428/216; 428/446; 428/448; 428/698; 423/213.5; 423/445 B; 423/447.5; 423/345
[58] Field of Search ............. 428/367, 408; 423/213.5, 445, 447.5, 449

[56] References Cited

U.S. PATENT DOCUMENTS 4,795,677  1/1989  Gray .................... 428/240

*Primary Examiner*—George P. Lesmes
*Assistant Examiner*—Kathryne E. Shelborne
*Attorney, Agent, or Firm*—Foley & Lardner

[57] ABSTRACT

A silicon carbide coated carbon matrix/carbon fiber composite material is provided. The carbon composite base material, coated with silicon carbide, comprises a siliconized layer and a non-siliconized layer. The siliconized layer comprises silicon carbide matrix and non-siliconized carbon fibers. The siliconized layer also has a non-planar interface with a series of elongated protrusions penetrating into the surface the of non-siliconized layer. A gas-permeable intermediate coating formed on the carbon composite material can help produce such a siliconized layer.

18 Claims, 3 Drawing Sheets

SILICON CARBIDE COATED CARBON COMPOSITE MATERIAL AND METHOD FOR MAKING SAME

This application is a continuation of application Ser. No. 08/047,375, filed Apr. 15, 1993, which is a continuation of application Ser. No. 07/773,316, filed Oct. 10, 1991, both now abandoned.

BACKGROUND OF THE INVENTION

1. Field of the Invention

This invention relates to silicon carbide coated carbon composite material and to a method for making the material.

More specifically, the present invention relates to a silicon carbide coated carbon matrix/carbon fiber (C/C) composite material which can be used, for example, as a susceptor (wafer holder) in the epitaxial chemical vapor deposition process in manufacturing semiconductors, as a heater or crucible in a semiconductor crystal pulling process, as a wall material in a nuclear fusion furnace, as a turbine blade, as a brake pad material for aircraft, and as a heat resistant material, e.g., an exterior wall of an aircraft or a spacecraft. The material of this invention is suitable for use as a component which is required to have high heat resistance and reliability (long life).

2. Description of Related Art

Carbon composite material which comprises carbon matrix and carbon fiber is recently finding many uses because of its high strength. Normally, such a carbon composite material comprises carbon matrix and carbon fibers for reinforcement. Threads, whiskers, textile, and nonwoven textile, which comprise carbon (graphite), are used as fibers. Those fibers are distributed in the carbon matrix in a parallel direction, two dimensionally or three dimensionally. All such carbon matrix/carbon fiber composite materials are referred to as carbon composite material in this specification.

Conventionally, silicon carbide coated carbon composite material is used for chemical or mechanical applications because of its excellent chemical resistance and mechanical strength, for example, in the semiconductor industry. In these conventional silicon carbide coated carbon composite materials, the silicon carbide coating is formed by one or more of the methods described below, individually or in combination:

a) Chemical vapor deposition (CVD) method. This is the most popular method. In this method, silicon carbide coating is formed from chemical reaction of gaseous materials. Relatively high density, tight coatings can be accomplished.

b) Siliconizing method. In this method, a silicon containing gaseous material is introduced at the surface of the carbon composite material, and a certain range of the carbon from the surface of the carbon composite material is siliconized to become silicon carbide.

c) Spreading method. In this method, a material comprising silicon carbide is painted on the carbon composite material and subjected to heat to form a coating.

d) Impregnation method. In this method, carbon composite material is prepared to have a relatively porous surface, and melted silicon liquid is introduced at the surface of the carbon composite. Carbon in a certain range from the surface of the carbon composite material is siliconized by a reaction with melted silicon. The coating produced by this method comprises silicon carbide and metallic silicon.

Conventional silicon carbide coated carbon composite materials are usually used under severe thermal conditions in which the material receives a thermal shock, such as rapidly heating and rapidly cooling, e.g., from room temperature to 1200° C. or the reverse. When the silicon carbide coated carbon composite material is used under such conditions for a long time, microcracks are produced in the coating due to the difference of the heat expansion coefficient between the silicon carbide coating and the carbon composite material. In some cases, because of the extension of the microcracks, the coating will peel off from the surface, or oxidation of the carbon composite material will occur.

An attempt to absorb and relieve stress caused by the difference of the thermal expansion coefficient between the two materials has been carried out. In this attempt, with reference to FIG. 3, a siliconized layer 12 is formed in the carbon composite material near the surface before forming a silicon carbide coating 13. The carbon fibers in the carbon composite material are also siliconized near the surface to a depth of about 30 μm to about 200 μm or more, and this siliconization of carbon fibers worsens the properties of the surface area because of the loss of carbon fibers. This means there are no differences from normal carbon material, i.e., the surface is no longer carbon fiber reinforced carbon material. In such a case, the difference of thermal expansion coefficient is not-improved. It also decreases not only the thermal shock resistance but also the strength of the carbon composite material.

There is a need to provide a silicon carbide coated carbon material which has improved thermal shock resistance and high mechanical strength.

There is also a need to provide a method for producing such an improved silicon carbide coated carbon composite material.

SUMMARY OF THE INVENTION

It is therefore an object of this invention to provide an improved silicon carbide coated carbon composite material.

It is a further object of the invention to provide a silicon carbide coated carbon composite material having high thermal shock resistance and mechanical strength.

It is another object of this invention to provide a method for making such a silicon carbide coated carbon composite material.

According to this invention, the foregoing objects are achieved by providing a silicon carbide coated carbon composite material in which the carbon composite material comprises carbon matrix and carbon fibers for reinforcement. The material comprises a carbon composite base comprising a non-siliconized layer of the carbon composite material and a siliconized layer extending from one surface of the carbon composite base, wherein the siliconized layer comprises a silicon carbide matrix, which is due to the siliconization of the carbon matrix, and at least a portion of the carbon fibers which comprise non-siliconized carbon; and a substantially impermeable silicon carbide coating formed on the one surface of the carbon composite base.

According to another aspect of this invention, there is provided a method for making a silicon carbide coated carbon composite material, in which the carbon composite material comprises carbon matrix and carbon fibers. The method comprises the steps of providing a base of the carbon composite material; siliconizing a predetermined range of depth, from one surface of the base, of the carbon matrix of the carbon composite material, while maintaining the carbon fibers substantially carbonaceous within the range of depth;

and coating an impermeable silicon carbide layer on the one surface of the base.

Further objects, features and advantages of the present invention will become apparent from the detailed description of preferred embodiments that follows, when considered together with the attached figures of drawing.

BRIEF DESCRIPTION OF THE DRAWINGS

This invention is described with reference to the following detailed description taken in conjunction with the drawings in which.

DETAILED DESCRIPTION OF THE PREFERRED EMBODIMENTS

Preferred embodiments of silicon carbide coated carbon composite material in accordance with this invention and the method for making the same will be described with reference to the drawings.

Figure 1A:
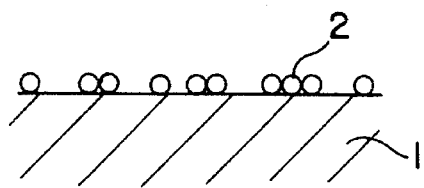
FIG. 1a is a sectional view showing a carbon composite material at one step of this invention.
Figure 1B:
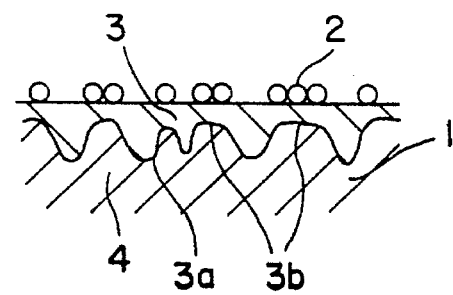
FIG. 1b is a sectional view showing a carbon composite material at another step of this invention.
Figure 1C:
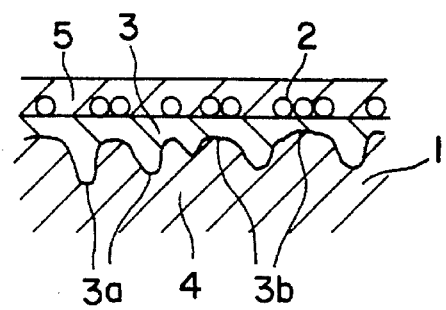
FIG. 1c is a sectional view showing a carbon composite material at another step of this invention.

With reference to FIG. 1a to 1c, a silicon carbide coated carbon composite material of this invention comprises a carbon composite base 1 comprising siliconized layer 3, non-siliconized layer 4, and a silicon carbide coating 5. According to this invention, producing silicon carbide as a result of a reaction of carbon material in the carbon composite material is designated by the term "siliconize."

The siliconized layer 3 which extends from the surface of the carbon composite base 1 comprises a silicon carbide layer, i.e., siliconized-layer 3 extending from the surface of the carbon composite base 1, and carbon fibers (not shown, but which will be shown in FIG. 5 and 6), i.e., non-siliconized, remaining carbon fiber. Keeping the carbon fiber substantially carbonaceous is important for this invention. The surface (interface with the silicon carbide matrix) of such carbon fibers might be siliconized, but such fibers are also within the scope of the invention.

The siliconized layer has a non-planar interface with the non-siliconized layer, with a series of elongated protrusions defined with peaks and bottoms and penetrating into the carbon composite base. In this specification, the points which reach the deepest into the non-siliconized layer are designated "peaks" and are indicated as 3a. The points which are the shallowest with respect to the non-siliconized layer are designated "bottoms" and are indicated as 3b.

The siliconized layer has an average thickness of from about 10 µm to about 2000 µm, preferably from about 20 µm to 200 µm. If the average thickness is less than 10 µm, the benefit of providing the siliconized layer cannot be accomplished. If the average thickness of the siliconized layer is more than 2000 µm, siliconization of carbon fibers near the surface will begin.

According to this invention, the peaks are preferably distributed in the carbon composite base with a spacing of from about 5 µm to about 500 µm, more preferably from about 20 µm to about 200 µm. The ratio of the average distance from the surface of the carbon composite base to the peaks, compared to the average distance from the surface of the carbon composite base to the bottoms is preferably from about 1:0.2 to 1:0.6, more preferably from about 1:0.35 to 1:0.45.

One of the objects for forming such an interface is to provide a layer which comprises carbon and silicon carbide and has an intermediate thermal expansion coefficient between that of carbon and that of silicon carbide. Another object is to increase the interface area to decrease the stress applied to the interface. This object can be achieved by having the carbon fibers not be siliconized and forming an interface described above.

If the spacing of the peaks is less than 5 µm or the above described ratio is greater than 1:0.6, the interface will become flat, and thermal resistance will be decreased. If the spacing is more than 500 µm, the thermal expansion coefficient will not be much improved. If the ratio is below 1:0.2, microcracks will tend to easily occur on the interface of the coating and the siliconized layer.

Formation of a siliconized layer having the above properties can be achieved by forming an intermediate gas-permeable coating 2 between the carbon composite base and the substantially impermeable silicon carbide coating. The intermediate gas-permeable coating is preferably comprised of silicon carbide, in order to have substantially the same thermal expansion coefficient of the coating layer and the siliconized layer. β-Silicon carbide intermediate coating is preferably formed because β-silicon carbide is easy to provide properties that follow. The intermediate gas-permeable coating preferably has an average pore size of from about 1 µm to about 50 µm and an average thickness of from about 1 µm to about 50 µm, more preferably an average thickness of from about 5 µm to about 30 µm.

This intermediate gas-permeable coating acts as a barrier when the siliconized layer is formed during manufacturing. Siliconization is preferably carried out by introducing gaseous material containing silicon throughout the intermediate coating to the surface of the carbon composite base. Because the purpose of the intermediate coating is to form such a siliconized layer described above, the intermediate layer can be substantially removed before forming an impermeable coating layer. If the intermediate coating is not removed before forming a substantially impermeable silicon carbide coating, the β-silicon carbide in the intermediate coating will change into α-silicon carbide during the formation of impermeable coating.

If the average pore size is less than 1 µm or the average thickness is more than 50 µm, siliconization of the carbon composite base through this coating will become difficult. If the average pore size is more than 50 µm or the average thickness is less than 1 µm, siliconization of the carbon composite base through this coating will take place so easily that the thickness of the siliconized layer will become too thick and also the siliconization of carbon fibers will take place.

The substantially impermeable silicon carbide coating which preferably comprises α-silicon carbide has preferably an average thickness of from about 20 μm to 2000 μm, more preferably from about 40 μm to 120 μm. If the thickness of the impermeable silicon carbide coating is less than 20 μm, the coverage will not be sufficient and oxidation of the carbon composite base will tend to occur easily. If the thickness of the impermeable silicon carbide coating is more than 2000 μm, the stress due to the difference of thermal expansion coefficient will increase to cause a decrease in the thermal shock resistance.

The carbon composite material can be selected according to the purpose or usage. A starting carbon composite material having a density of from about 1.50 g/cm³ to about 1.90 g/cm³, (which will be the same as a density of the final non-siliconized layer) is usually used.

For construction of equipment used in a semiconductor device manufacturing process, a carbon composite base material having a density of from about 1.60 g/cm³ to 1.85 g/cm³ will preferably be selected. Also for such equipment, carbon composite material in which the carbon fiber is distributed two dimensionally or in which carbon whiskers are distributed is preferably used. For a heat resistant material used for making spacecraft, for example, an external wall, a carbon composite base material having a density of from about 1.70 g/cm³ to 1.85 g/cm³ will preferably be selected. Also for these uses, carbon composite material in which the carbon fibers are distributed in a parallel direction is preferably used.

The method for making a silicon carbide coated carbon composite material according to this invention will be described. With reference to FIG. 1a, a carbon composite base 1 is provided. To form a siliconized layer 3 in FIG. 1b having a non-planar interface with a series of elongated protrusions penetrating into the surface of the carbon composite base, a gas-permeable intermediate coating 2 is preferably formed on the surface of the base. The intermediate layer preferably consists essentially of silicon carbide having substantially the same thermal expansion coefficient as the siliconized layer 3 and the silicon carbide coating to be formed. A mixture of SiCl₄ gas, methane gas and hydrogen gas is popular to form a silicon carbide coating at high temperature. Then, with reference to FIG. 1b, a gaseous composition which comprises silicon and can react with carbon to produce silicon carbide is introduced at the surface. The siliconizing reaction begins from the surface which is not covered by the intermediate coating 2. Siliconization occurs under the coating by way of the uncovered surface. Because of the system of siliconization, the interface having a series of protrusions is produced. Siliconization is continued until the average thickness of the siliconized layer reaches the predetermined value.

It is not accurately known by the inventors why the carbon fibers in the siliconized layer are not siliconized, i.e., why the carbon fibers do not react to form silicon carbide. While not wishing to be bound by any theory, the inventors presently believe that the difference of density between the carbon matrix and the carbon fibers and the non-uniform siliconization cause the preferential siliconization of carbon matrix, which is usually made by carbonization (or graphitization) of resin and has a relatively low density compared to the carbon (graphite) fibers.

With reference to FIG. 1c, after forming a siliconized layer 3, an impermeable silicon carbide coating 5 is formed on the surface of the carbon composite base by means of a conventional method.

The following examples further illustrate preferred embodiments within the scope of the invention, and do not limit the invention in any manner.

EXAMPLE 1

Figure 2:
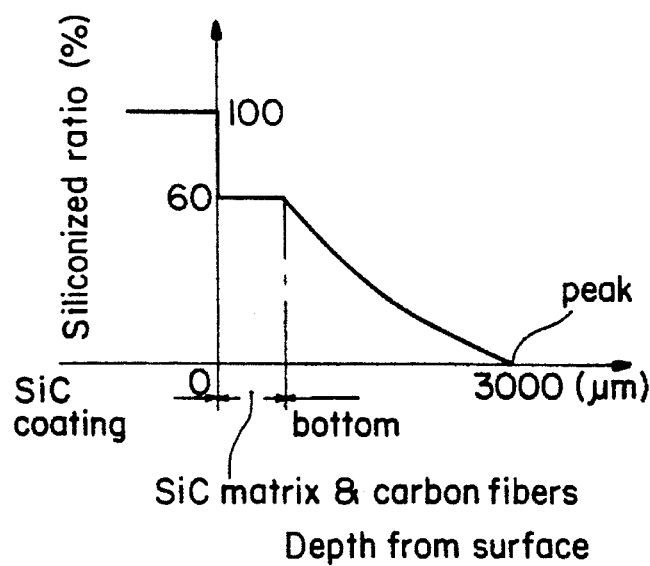
FIG. 2 is a graph showing a relationship between the siliconized ratio of the siliconized layer and the depth from the surface of the carbon composite base of this invention.
Figure 3:
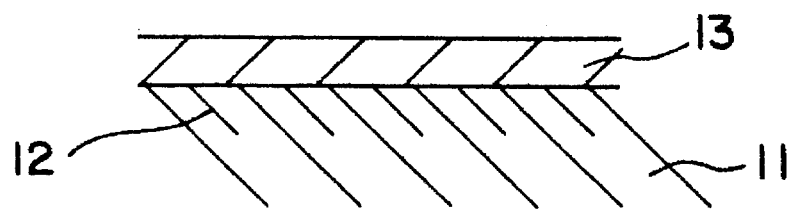
FIG. 3 is a sectional view of a related art showing a silicon carbide coated carbon composite material.
Figure 5:
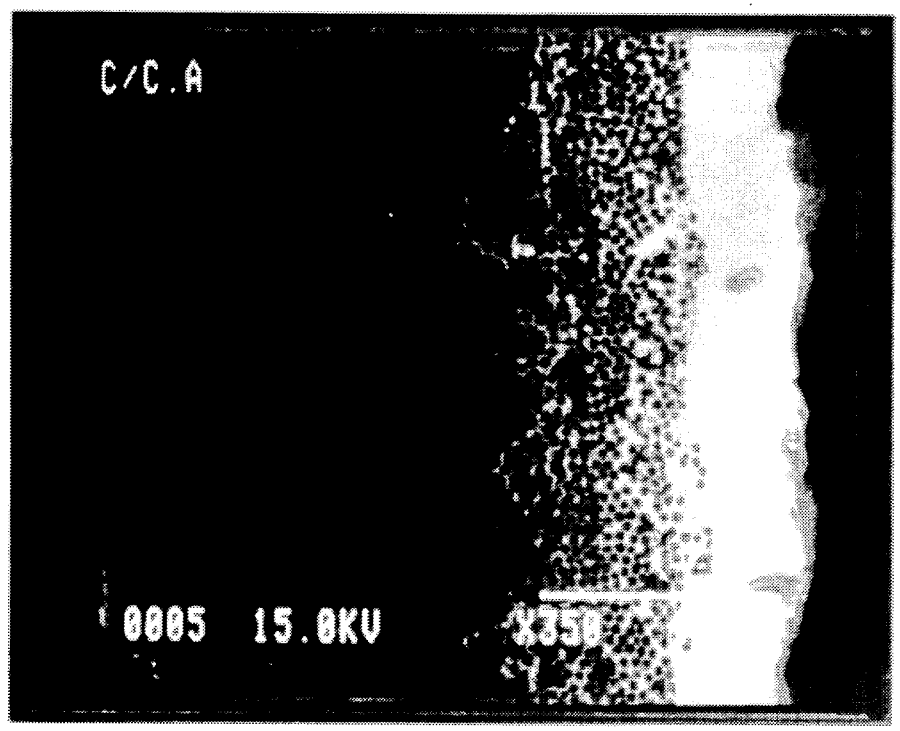
FIG. 5 is a sectional electron microscopic photograph showing a microstructure of the silicon carbide coated carbon composite material of this invention.
Figure 6:
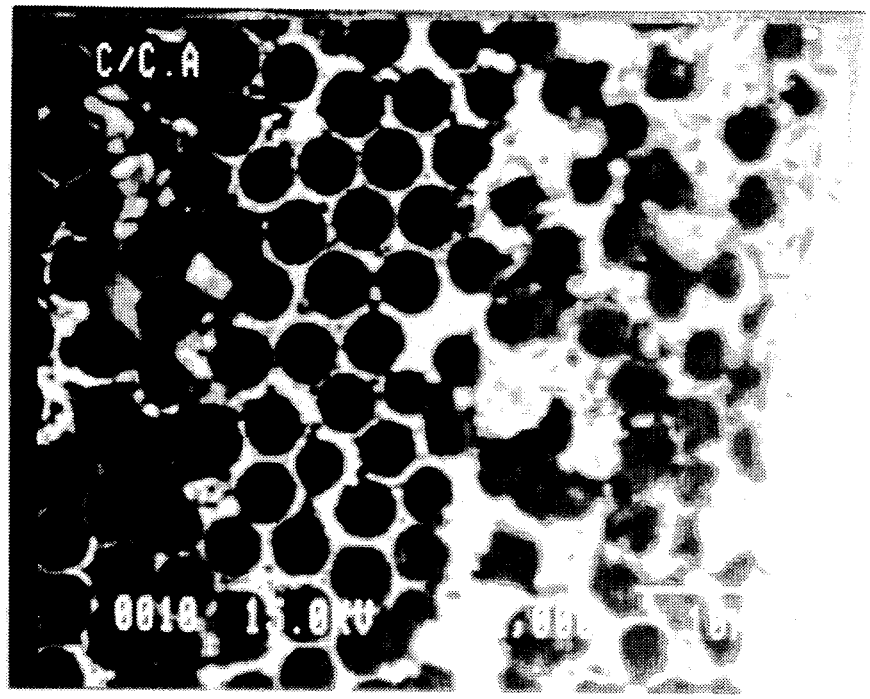
FIG. 6 is a sectional electron microscopic photograph showing a microstructure of the siliconized layer of this invention.

A carbon composite base (2×5×30 mm) having a density of 1.8 g/cm³, comprising carbon (graphite) fibers distributed two dimensionally, and made from 1-(2-pyridylazo)-2-naphthol was placed in the reaction furnace. By introducing SiCl₄ at a flow rate of 3 liter/min., methane gas at a flow rate of 3.3 liter/min, and hydrogen gas at a flow rate of 70 liter/min, a porous, gas-permeable intermediate coating having a thickness of 20 μm and pore diameter of from about 1 to 50 μm is formed at the temperature of 1500° C. at a depositing speed of from 1 μm/hr to 10 μm/hr. Then, a siliconized layer having an average thickness of 60 μm was formed by introducing SiO (silicon mono-oxide) gas at the surface of the base at 1500° C. After forming the siliconized layer, the siliconized ratio (which is defined as the volume of the silicon carbide as a percentage of the whole volume) was measured. The result is shown in FIG. 2. Then, an impermeable silicon carbide coating having a thickness of 30 μm is formed on the surface of the carbon composite base by introducing a mixture of 1.5 liter/min. of methyl tetrachlorosilane and 100 liter/min. of hydrogen gas at 1500° C. at a depositing speed of from 5 μm/hr to 10 μm/hr. This impermeable silicon carbide coating was well bonded to the siliconized layer and/or the gas-permeable intermediate coating. A sectional view of the resulting silicon carbide coated carbon composite material was observed by an electron microscope. The photograph of observed microstructure is shown in FIG. 5 and FIG. 6. In those Figs. appearing as black circles are carbon (graphite) fibers, appearing as white surrounding the carbon fibers is silicon carbide (siliconized carbon) and appearing as a white belt on the right side is the silicon carbide coating.

Ten samples having dimensions of 10×5×60 mm were prepared by the same manner described above, and those were subjected to a thermal shock resistance test in which each sample was heated to 1200° C. in the furnace then brought out from the furnace at room temperature (about 25° C.), and after every 5 times the surface was observed. After 50 cycles of the thermal shock resistance test, neither microcracks nor peeling of the coating were observable with the human eye. A measured average bending strength of another five samples was 65 MPa.

EXAMPLE 2 (COMPARATIVE)

Figure 4:
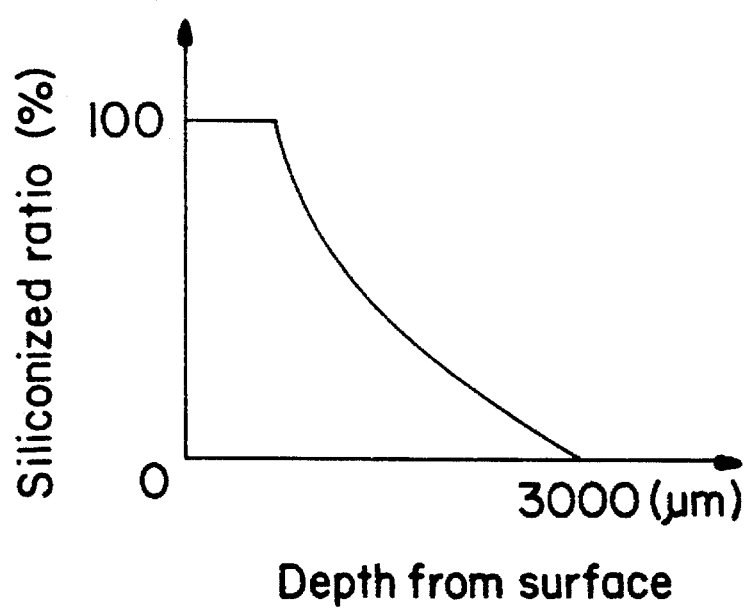
FIG. 4 is a graph showing the relationship between the siliconized ratio of the siliconized layer and the depth from the surface of the carbon composite base of the related art.

Example 1 is repeated except for the step of forming the gas-permeable intermediate coating. The measured siliconization ratio is shown in FIG. 4. The resulting samples in accordance with this example were subjected to the thermal shock resistance test. After 5 cycles of an average thermal shock, all samples had a microcracks and the silicon carbide coating was peeled off from some of them. A measured average bending strength of another five samples was 35 MPa.

It can be understood from FIG. 2 that there is no portion in the siliconized layer according to this invention that is 100% siliconized. In FIG. 2, the flat place at 60% shows that there are 60 wt. % (against the weight of siliconized layer including silicon carbide) made up of carbon fibers that remained carbonaceous and not siliconized. It can also be understood from comparison of FIG. 2 and FIG. 4 that forming a gas-permeable intermediate layer is very suitable to maintain carbon fibers carbonaceous in the siliconized layer.

It is obvious that the silicon carbide coated carbon composite material containing non-siliconized carbon fibers according to this invention, such as the material made in Example 1, has high thermal shock resistance and mechanical strength compared to the material having a 100% siliconized layer, such as the material made in Example 2.

The foregoing description has been set forth merely to illustrate the invention and is not intended to be limiting. Since modifications of the described embodiments incorporating the spirit and substance of the invention may occur to persons skilled in the art, the scope of the invention should be construed as including all variations falling within the appended claims and equivalents.

What is claimed is:

1. A silicon carbide coated carbon composite material, comprising:
   (i) a base formed of a carbon composite material comprising a carbon matrix and carbon fibers, wherein said base comprises:
      (a) a non-siliconized layer of said carbon composite material and
      (b) a siliconized layer of said carbon composite material comprising a silicon carbide matrix formed on one surface of said carbon composite base, wherein at least a portion of the carbon fibers in said siliconized layer are not siliconized,
      wherein said siliconized layer has an average thickness of from about 10 μm to about 2000 μm,
      wherein said siliconized layer has a non-planar interface with the non-siliconized layer, said interface including a series of elongated protrusions of said siliconized material defined with peaks and bottoms, said peaks penetrating into the non-siliconized layer of said carbon composite base, wherein said peaks are distributed with a spacing of from about 5 μm to about 500 μm, and wherein a ratio of average distance from said one surface of the carbon composite base to the peaks, to average distance from said one surface of the carbon composite base to the bottoms is from about 1:0.2 to about 1:0.6; and
   (ii) a substantially impermeable silicon carbide coating formed on said one surface of said carbon composite base, wherein said substantially impermeable silicon carbide coating has an average thickness of from about 20 μm to about 2000 μm.

2. A silicon/carbide coated carbon composite material according to claim 1, wherein the peaks are distributed with a spacing of from about 20 μm to about 200 μm.

3. A silicon carbide coated carbon composite material according to claim 1, wherein a ratio of average distance from said one surface of the carbon composite base to the peaks, to average distance from said one surface of the carbon composite base to the bottoms is from about 1:0.35 to about 1:0.45.

4. A silicon carbide coated carbon composite material according to claim 1, wherein the siliconized layer consists essentially of silicon carbide matrix and substantially carbonaceous fibers.

5. A silicon carbide coated carbon composite material according to claim 1, wherein the substantially impermeable silicon carbide coating has an average thickness of from about 40 μm to 120 μm.

6. A silicon carbide coated carbon composite material according to claim 1, further comprising a gas-permeable intermediate layer between the carbon composite base and the substantially impermeable silicon carbide coating.

7. A silicon carbide coated carbon composite material according to claim 6, wherein the gas-permeable intermediate coating layer comprises silicon carbide.

8. A silicon carbide coated carbon composite material according to claim 6, wherein the gas-permeable intermediate coating has an average pore size of from about 1 μm to about 50 μm and an average thickness of from about 1 μm to about 50 μm.

9. A silicon carbide coated carbon composite material according to claim 8, wherein the gas-permeable intermediate coating has an average thickness of from about 5 μm to about 30 μm.

10. A silicon carbide coated carbon composite material according to claim 1, wherein the non-siliconized layer has a density of from about 1.50 g/cm$^3$ to about 1.90 g/cm$^3$.

11. A silicon carbide coated carbon composite material according to claim 1, formed by a process comprising the steps of:
    (i) providing a base of said carbon composite material;
    (ii) siliconizing the carbon matrix of a predetermined range of depth of one surface of said base while maintaining the carbon fibers of said one surface of said base substantially carbonaceous within said range of depth, thereby forming said siliconized layer; and
    (iii) coating an impermeable silicon carbide layer on said one surface of said base.

12. A material according to claim 11, wherein said process further comprises the step of forming a gas-permeable intermediate coating between said base and said impermeable silicon carbide layer, prior to said siliconizing step (ii).

13. A material according to claim 12, wherein said intermediate coating comprises silicon carbide.

14. A material according to claim 12, wherein said process further comprises removing said gas-permeable intermediate coating prior to said impermeable coating step (iii).

15. A silicon carbide coated carbon composite material according to claim 1, wherein the non-siliconized layer has a density of from about 1.70 g/cm$^3$ to 1.85 g/cm$^3$.

16. In an exterior surface structure for a spacecraft or an aircraft, the improvement comprising the composite material of claim 15.

17. A silicon carbide coated carbon composite material according to claim 1, wherein the non-siliconized layer has a density of from about 1.60 g/cm$^3$ to 1.85 g/cm$^3$.

18. In an apparatus for manufacturing semiconductor devices comprising a member subjected to high temperature fluctuations, the improvement wherein said member is made of a material comprising the material of claim 17.

* * * * *